July 23, 1968 W. G. SCHMIDT 3,394,267
MULTIFUNCTION HIGH EFFICIENCY LOGICAL CIRCUIT ELEMENT
Filed Dec. 7, 1964
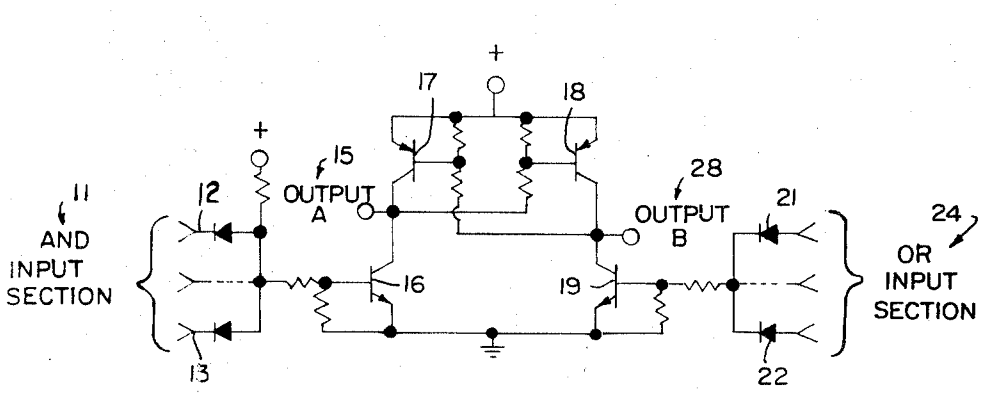
INVENTOR
WILLIAM G. SCHMIDT
BY,
Richard F. Bonway
ATTORNEY 3,394,267
Patented July 23, 1968

3,394,267

MULTIFUNCTION HIGH EFFICIENCY LOGICAL CIRCUIT ELEMENT

William G. Schmidt, Burlington, Mass., assignor to Massachusetts Institute of Technology, Cambridge, Mass., a corporation of Massachusetts Filed Dec. 7, 1964, Ser. No. 416,332
1 Claim. (Cl. 307—215)

This invention relates to transistorized logic circuits and more particularly to an integrated circuit element which performs several logical functions and can be fabricated into a standardized building block element for use in digital data processing equipment.

R. H. Baker in U.S. Patent No. 3,010,031 discloses high efficiency flip-flop circuits. That invention provides maximum efficiency storage elements for digital equipment. The necessary logical circuits associated with the above storage elements continued to dissipate large amounts of power. The present invention provides maximum efficiency logical circuit elements which in turn permits the fabrication of an entire data system having maximum efficiency.

Efficiency in this instance is defined in terms of power dissipation per function performed. The present invention, then, has an efficiency at least one order of magnitude greater than that which is presently available.

The growth of microelectronics has placed great emphasis on the need for high-performance building block elements. Each function—OR, AND, NOR and NAND gates—has had its own peculiar circuit configuration; consequently, four separate building blocks were necessary. The present invention advances standardization with its attendant economy and efficiency substantially by providing a single building block capable of performing all of these functions.

Therefore, an object of this invention is to provide a maximum efficiency gate circuit.

Another object of this invention is to provide a single gate circuit able to perform several gate functions.

Another object of this invention is to provide an integrated circuit element of high efficiency and speed able to perform the gate functions of—OR, AND, NOR and NAND.

Other objects and features of this invention will become more apparent from the following detailed description when taken in connection with the attached drawing which shows a circuit embodying the present invention.

The circuit as illustrated has two input sections, an OR input section 24 and an AND input section 11. Diodes 12, 13, 21 and 22 are shown as the logic input elements; however, other types of logic systems can easily be substituted without affecting the operation of my invention.

Transistors 16 and 19 are gating transistors, the input signals to which insure that only one of these transistors is conducting at any time. Transistors 17 and 18 are used as load transistors and are coupled such that when 16 is conducting, 17 is not conducting, and when 16 is not conducting, 17 is conducting. The same relationship exists between transistors 18 and 19. This insures that the output impedance of the circuit is always that of a conducting transistor, which is very desirable, as well as enabling the circuit to operate at much higher speeds than would be possible with resistors in place of the load transistors. Since the only currents circulating in the circuit are base currents, the circuit efficiency is maximized for its power dissipation.

Two outputs are provided, output A15 and output B28. These outputs are complementary; that is, output A is the logical complement of output B, i.e. $A=\overline{B}$.

The inputs must also be complementary. That is, if an AND input were applied to the circuit at, for instance, diode 12, the corresponding logical complement would necessarily be applied to diode 21. Accordingly, the inputs as well as the outputs would be complementary.

If this circuit is used to function as an AND or NAND gate, the input diodes of AND input section 11 are used. The complements of these functions are put into OR input section 24. The NAND function output appears at output A15 while the AND function output appears at output B28. These functions are, of course, complementary.

If this circuit is used to function as an OR or NOR gate, the input diodes of OR input section 24 are used. The complements of these functions are put into AND input section 11. The OR function output appears at output A15 while the NOR function output appears at output B28. These functions are, of course, complementary also, and, accordingly, are easily used for driving subsequent logical gates.

For a specific example: A gate output signal is desired on $(X \times Y)$; the X signal and the Y signal are applied to AND input section 11; $\overline{X}$ and $\overline{Y}$ signals are applied to OR input section 24; output B is $(X \times Y)$ and output A is $\overline{(X \times Y)}$.

The low-power dissipation but high-speed performance is achieved by the use of the complementary operating transistor at each output. The gating of the NPN transistors assures that each output is driven by one saturated transistor.

The input sections are implemented with diode logic merely for illustration. Any type of logic which results in an NPN invertor for the last element may be used in the lower half, or driving section, of the circuitry. The drives must, however, be logical complements. The circuit outputs OR, AND, NOR and NAND will reflect the input logic accordingly. Gating is shown to be performed with the NPN gate transistors but the PNP transistors may also be used as gates and the NPN transistors used as the load transistors.

This circuit provides an ideal logical "building block" element in that all common logical operations are possible with it. The extremely low power dissipation of the circuit allows highly reliable operation as well as permitting extremely high packaging densities, much promised by monolithic semiconductor structures, but hitherto impractical due to high thermal densities.

While I have described the principles of my invention in connection with specific apparatus, it is to be clearly understood that this description is only made by way of example and not as a limitation on the scope of my invention as set forth in the objects thereof and in the accompanying claims.

What is claimed is:

1. A multifunction, high speed, high efficiency logical gating circuit comprising, a source of energizing potential, two conductive current paths, each path consisting of a PNP and an NPN transistor connected serially at their collector terminals with their emitters polarized for conduction, resistance means coupling a preselected transistor in each path from their common emitter terminal to their respective base terminals and a collector terminal of the opposing transistor, a first input means connected to the emitter-base section of a preselected transistor in one of said current paths, a second input means connected to the emitter-base section of a preselected transistor in the remaining current path, said first input means receiving OR inputs and said second input means receiving AND inputs.

(References on following page)

References Cited

UNITED STATES PATENTS

| | | | |
|---|---|---|---|
| 3,010,031 | 11/1961 | Baker | 307—88.5 |
| 3,078,376 | 2/1963 | Lewin | 307—88.5 |

OTHER REFERENCES

Keister et al., Design of Switching Circuits (textbook), Van Norstrand, 1951, Tk–2831–K4, pp. 217 through 226 relied on.

Kvamme, Microelectronics Using General Electric Emitter-Coupled Logic Operations, General Electric Application Note 90.80, August 1962, p. 10 relied on.

Marsocci, A Survey of Semiconductor Devices and Circuits in Computers, pt. 2, Semiconductor Products (magazine), January 1961, p. 31 relied on.

Motorola Semiconductor Products, Inc. Data Sheet #DS 9001–R1, August 1963.

ARTHUR GAUSS, *Primary Examiner.*

J. D. FREW, *Assistant Examiner.*